United States Patent
Chang

(10) Patent No.: US 11,038,510 B2
(45) Date of Patent: Jun. 15, 2021

(54) OSCILLATOR WITH TIME ERROR CORRECTION

(71) Applicant: Timecubic, Inc., Woburn, MA (US)

(72) Inventor: Sheng Chang, Woburn, MA (US)

(73) Assignee: Timecubic, Inc., Woburn, MA (US)

( * ) Notice: Subject to any disclaimer, the term of this patent is extended or adjusted under 35 U.S.C. 154(b) by 246 days.

(21) Appl. No.: 16/425,476

(22) Filed: May 29, 2019

(65) Prior Publication Data

US 2020/0382125 A1    Dec. 3, 2020

(51) Int. Cl.
*H03L 1/02* (2006.01)
*H04B 7/26* (2006.01)
*G01V 13/00* (2006.01)

(52) U.S. Cl.
CPC .............. *H03L 1/022* (2013.01); *G01V 13/00* (2013.01); *H04B 7/2693* (2013.01); *G01V 2200/12* (2013.01)

(58) Field of Classification Search
CPC ...................................................... H03L 1/022
USPC ........................................................ 702/85
See application file for complete search history.

(56) References Cited

U.S. PATENT DOCUMENTS

| | | | |
|---|---|---|---|
| 6,757,217 B2 | 6/2004 | Eastwood et al. | |
| 6,898,148 B2 | 5/2005 | MacKay | |
| 7,660,201 B2 | 2/2010 | Fleure et al. | |
| 8,259,531 B2 | 9/2012 | Lie | |
| 8,605,543 B2 | 12/2013 | Ray et al. | |
| 9,297,917 B2 | 3/2016 | Mah et al. | |
| 9,417,359 B2 | 8/2016 | Gateman et al. | |
| 9,425,652 B2 | 8/2016 | Rippon et al. | |
| 9,465,124 B2 | 10/2016 | Ray et al. | |
| 2002/0114400 A1* | 8/2002 | Bombay | H04L 27/2679 375/260 |
| 2004/0162046 A1* | 8/2004 | Yamauchi | H03J 7/02 455/260 |
| 2018/0203419 A1* | 7/2018 | Kinoshita | G04R 20/04 |
| 2018/0267162 A1* | 9/2018 | Olson | G01S 13/765 |

* cited by examiner

*Primary Examiner* — Joseph Chang
(74) *Attorney, Agent, or Firm* — John A. Arsenault; Daniel M. Dubuisson

(57) ABSTRACT

A system and method for making time error estimations and time corrections for substantially long deployment times are provided. The system has a low power local oscillator, a power source, a processor, a computer-readable storage medium, a phase meter, a counter circuit, a temperature sensor, and a communication port. Time signal measurements and frequency signal measurements are made at a first time and at a second time, and time-dependent or both time and temperature-dependent time error estimations are generated for interval times between the first time and the second time using a dual-linear estimation technique. A corrected time-tag data set having highly accurate time-tags may then be generated from the time-dependent time error estimation or both the time and the temperature-dependent time error estimation.

15 Claims, 7 Drawing Sheets

OSCILLATOR WITH TIME ERROR CORRECTION

STATEMENT REGARDING FEDERALLY SPONSORED RESEARCH AND DEVELOPMENT

Not Applicable.

CROSS-REFERENCE TO RELATED APPLICATIONS

This application is related to and/or claims the benefit of the earliest available effective filing date(s) from the following listed application(s) (the "Priority Applications"), if any, listed below (e.g., claims earliest available priority dates for other than provisional patent applications or claims benefits under 35 USC § 119(e) for provisional patent applications, for any and all parent, grandparent, great-grandparent, etc. applications of the Priority Application(s)). In addition, the present application is related to the "Related Applications," if any, listed below.

FIELD OF THE DISCLOSURE

The present invention generally relates to highly accurate time sources and relates more specifically to error corrected time source devices with low power consumption requirements.

BACKGROUND OF THE DISCLOSURE

Oscillators, clocks, and other time sources play an important role for many types of data acquisition recorders. An accurate clock is typically used as an Analog to Digital Converter (ADC) clock that digitizes analog signals from sensors. Frequently in such applications, there are no Global Positioning System (GPS) timing signals or other types of reference time signals available, and therefore a real time ADC clock accuracy correction is not possible; however, if a clock behavior is well known, a post-acquisition data resampling is possible and such a post-acquisition system and method based on ADC clock correction improves data quality.

Ocean bottom node recorders, as one such application example, samples seismic sensor signals, and have become increasingly popular in the field of marine seismic exploration. In this case, a data acquisition recorder is deployed at each node of the seismic node network, and there are no cables interconnecting the nodes. Hydrophones and geophones are typically installed in the data acquisition recorders as sensors for measuring seismic signals. A time source for accurately timing the seismic signal data converter is integrated into each node along with components such as a power supply or battery, a microcomputer, a memory, and other supporting electronics.

This type of data acquisition system has several notable characteristics. The data acquisition recorders require low power consumption and the power source is not able to be recharged during long deployments. Data acquisition often occurs in GPS denied environments, and therefore accurate timing information is not available during the deployment of the node, which could last up to several months or more. Furthermore, the operation of exploration programs that utilize such data acquisition recorders is financially cumbersome.

During deployment of this type of seismic node at the ocean bottom, the frequency of the time source will drift from a nominal frequency due to aging, changes in ambient temperature, pressure, acceleration, or other factors, and a time error is consequently accumulated for the seismic data sampling clock. This time error results in ambiguous sampling of seismic data and therefore causes inaccurate mapping of oil and gas reserves. Any time source frequency drift or variation lessens the accuracy of data acquisition and thus negatively impacts the quality of the seismic investigation.

Historically, a Temperature Compensated Crystal Oscillator (TCXO) was used for marine seismic surveys owing largely to its characteristically low power consumption; however, TCXOs have not been able to provide an acceptably low enough time error for long term deployments. Oven Controlled Crystal Oscillators (OCXO) typically consume over one watt of power and are therefore not able to sustain a long time seismic survey operation owing to energy capacity limitations and the non-rechargeable nature of the power source.

Emerging OCXOs with significantly lower power consumption, typically on the order of two hundred milliwatts or less, have been developed and are able to provide a significant improvement in performance with regards to reduction of time error and low power operation. Other types of time sources, such as Chip Scale Atomic Clocks (CSAC), have been developed and are able to achieve significantly reduced time error but still consume on the order of two to three times more power than that of an emerging ultra-low power OCXO and are far more expensive to manufacture.

U.S. Pat. No. 5,697,082 describes a self-calibrating frequency standard system. In this self-calibrating timing system, a central node with an accurately known time reference, such as satellite GPS reference time signals or a cell phone tower reference time signal, is available. U.S. Pat. No. 5,940,458 describes a method for compensating for time error of time/frequency generator using an accurately known GPS time signal. Many other timing systems described in the art are configured to perform tedious error corrections that require significantly higher power consumption. What is needed is a cost effective clock system with ultra-low power consumption, consistent drift behavior, time error correction capability, and is able to provide highly accurate time signals in GPS denied environments and for long deployment times. Such a system opens the avenue for post data acquisition resampling by accurately correcting accumulated time error of the time source in relation to an absolute time reference.

SUMMARY OF THE DISCLOSURE

The present invention provides a system and method for making time error estimations and time corrections for several types of data acquisition recorders and sensor nodes. In a preferred embodiment, the system comprises a local oscillator, a phase meter, a computer-readable storage medium, a processor, a counter circuit, and a power source, wherein the processor is configured to generate a dual-linear time-dependent time error estimation or a dual-linear temperature-dependent time error estimation, wherein the local oscillator is configured to generate a periodic signal, wherein the periodic signal comprises a first frequency signal at a first time and a second frequency signal at a second time, wherein a first reference time signal, a first reference frequency signal, a second reference time signal, and a second reference frequency signal are communicated from a reference time source to the phase meter, wherein the phase meter is configured to measure the first frequency signal, the second frequency signal, a first time error, and a second time error, wherein the counter circuit is configured to receive the periodic signal from the local oscillator and generate a first time signal at a first time, a second time signal at a second time, and one or more interval time signals at corresponding interval times.

In embodiments, the local oscillator may be a TCXO, an OCXO, a MEMS time source, a lower power atomic oscillator, a low power microwave oscillator, an optical oscillators, a g-compensated oscillator, a mechanically mounted oscillator with shock and vibration isolation, a clock system further comprising a self-embodied phase meter or time interval counter circuit, or an independent one pulse per second counter circuit.

In various embodiments, the first time signal is synchronized with the first reference time signal, and the first frequency signal is calibrated to a nominal reference frequency signal. In various embodiments, the system further comprises a communication port configured to facilitate communication of information between the time error correcting clock system and a receiving device, an external measurement system, or the reference time source. In various embodiments, the time-dependent time error estimation is based on the first time signal, the first frequency signal, the second time signal, and the second frequency signal. In various embodiments, the processor is further configured to generate a corrected time-tag data set based on an uncorrected time-tag data set and one of either the time-dependent time error estimation or the temperature-dependent time error estimation.

In various embodiments, the system further comprises a temperature sensor configured to measure temperature in proximity to the local oscillator, wherein the temperature sensor generates a first temperature signal, a second temperature signal, or one or more interval temperature signals. In a further embodiment, the temperature-dependent time error estimation is based on the first temperature signal, the second temperature signal, or one or more interval temperature signals.

In a preferred embodiment, the system comprises a clock subsystem, a time error determination subsystem configured to generate a dual-linear time-dependent time error estimation or a dual-linear temperature-dependent time error estimation, and a communication subsystem, wherein the clock subsystem is configured to generate a first time signal and a first frequency signal at a first time and a second time signal and a second frequency signal at a second time. The system may further comprise a microcontroller configuration subsystem, a time error determination subsystem, and a time signal reconstruction subsystem. In a further embodiment, the system comprises a temperature determination subsystem configured to acquire a first temperature signal, a second temperature signal, or one or more interval temperature signals, wherein the time error determination subsystem is further configured to generate the time-dependent time error estimation based on the first temperature signal, the second temperature signal, or one or more interval temperature signals.

In a preferred embodiment, the method comprises the steps of determining a first time signal and a first frequency signal, determining a second time signal and a second frequency signal, and generating a time-dependent time error estimation from the first time signal, the first frequency signal, the second time signal, and the second frequency signal.

In various embodiments, the method further comprises the steps of generating the first time signal and the first frequency signal at a first time, receiving a first reference time signal and a first reference frequency signal, synchronizing the first time signal with the first reference time signal, calibrating the first frequency signal with the first reference frequency signal, generating the second time signal and the second frequency signal, generating one or more interval time signals, determining the interval time signals, losing reception of the reference time source for one or more of the interval times, receiving a second reference time signal and a second reference frequency signal, determining the second reference time signal at the second time, generating an uncorrected time-tag data set from the first time signal, the second time signal, or one or more interval time signals, generating a corrected time-tag data set from the time-dependent time error estimation and the uncorrected time-tag data set, wherein the first reference time signal and the first reference frequency signal are generated by a reference time source at the first time, wherein the second reference time signal and the second reference frequency signal are generated by the reference time source at the second time, wherein the time-dependent time error estimation is also generated from the first reference time signal and the second reference time signal.

In various embodiments, the method further comprises the steps of determining a first temperature signal at the first time, determining a second temperature signal at the second time, determining one or more interval temperature signals at the corresponding one or more interval times, generating a temperature-dependent time error estimation from the first temperature signal, the second temperature signal, or one or more interval temperature signals, and generating a corrected time-tag data set from the uncorrected time-tag data set and a total time-dependent time error estimation that is derived from the time-dependent time error estimation and the temperature-dependent time error estimation.

Embodiments include one, more, or any combination of all of the features listed above. Other features and advantages of the present invention will become apparent from the following more detailed description, taken in conjunction with the accompanying figures, which illustrate, by way of example, the principles of the invention.

DETAILED DESCRIPTION OF THE PREFERRED EMBODIMENTS

Figure 1A:
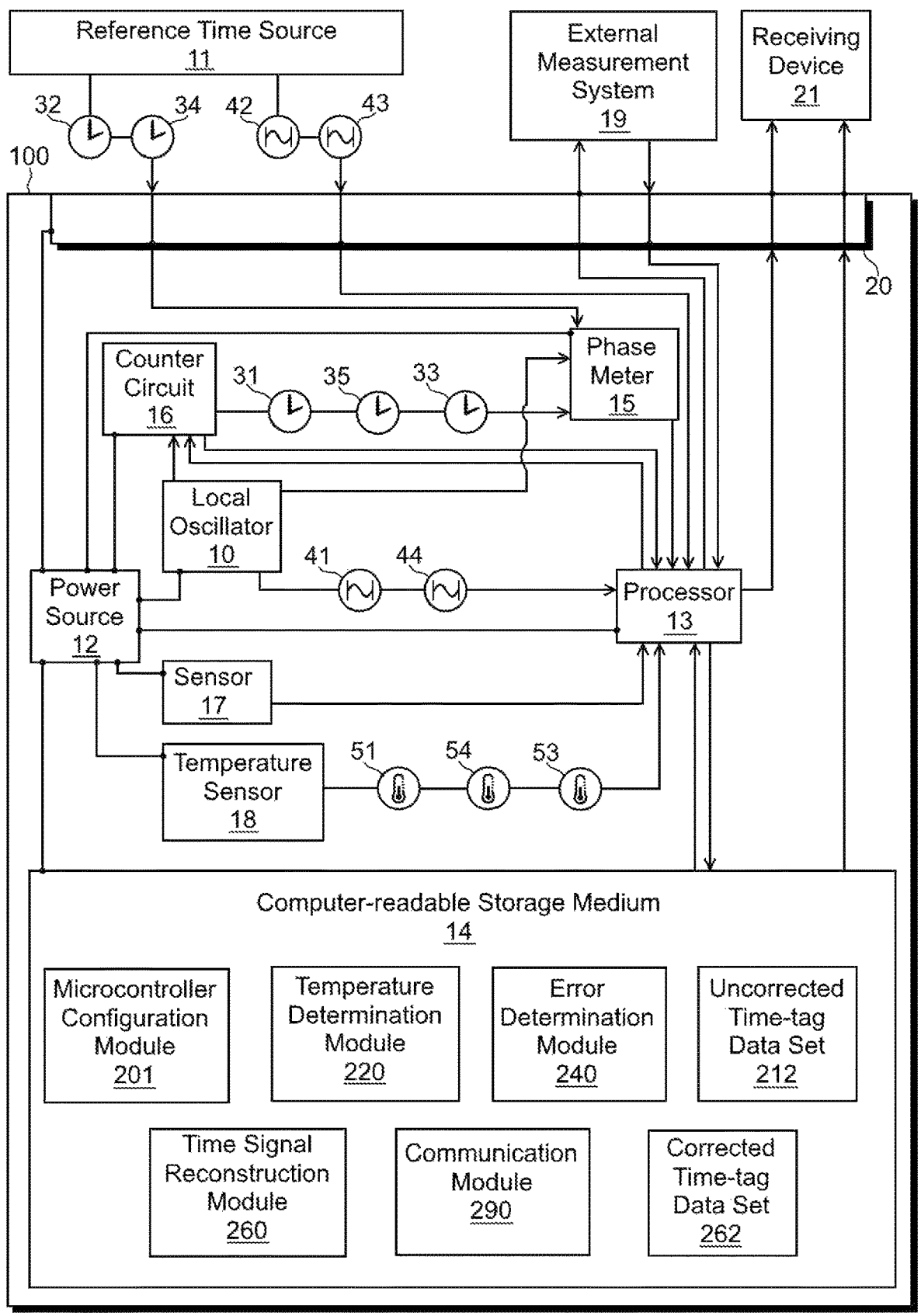
FIG. 1A illustrates a block diagram of a time error correcting clock system, in accordance with an exemplary embodiment of the present invention.

The following detailed description provides numerous details for a thorough understanding of various embodiments and an enabling description for these embodiments. One skilled in the relevant art will recognize that the present invention may be practiced without one or more of the specific details, or with other methods, components, materials, etc. In other instances, well-known structures, materials, operations or functions are not shown or described in detail to avoid unnecessarily obscuring the description of the embodiments.

The described features, operations, functions, or characteristics may be combined in any suitable manner in one or more embodiments. It will also be readily understood that the order of the steps or actions of the methods described in connection with the embodiments disclosed herein may be changed, as would be apparent to those skilled in the art. Thus, any order in the drawings or detailed description is for illustrative purposes only and is not meant to imply a required order unless specified to require an order.

FIG. 1A illustrates a block diagram of a time error correcting clock system 100, in accordance with an exemplary embodiment of the present invention. The system 100 may comprise a local oscillator 10, a power source 12, a processor 13, a computer-readable storage medium 14, a phase meter 15, a counter circuit 16, a temperature sensor 18, and a communication port 20. The local oscillator 10 may be any periodic device capable of tracking the passage of time or generating a periodic signal. A variety of local oscillators 10 are contemplated, including, but not limited to, a TCXO, an OCXO, a microelectromechanical systems (MEMS) time source, a lower power atomic oscillator, a low power microwave oscillator, an optical oscillator, or a clock system further comprising a self-embodied phase meter or time interval counter circuit, an independent one pulse per second counter circuit, or an external measurement system 19. It is further contemplated that other types of time sources may be used as a local oscillator 10 without loss of performance in regards to time error estimations and corrections. Examples of periodic signals generated by the local oscillator 10 include, but are not limited to, sinusoidal wave signals, square wave signals, triangle wave signals, and sawtooth wave signals. In embodiments, the local oscillator 10 may be a g-compensated oscillator or an oscillator that is mechanically mounted onto the system 100 in a manner that substantially isolates the local oscillator 10 from shock and vibration.

In various embodiments, the first time generally refers to a time just prior to the beginning of deployment of the system 100, and the second time generally refers to a time soon after deployment of the system 100 has ended. An interval time generally refers to a time between the first time and the second time. The reference time source 11 is any device capable of tracking the passage of time or generating a periodic signal, and which is presumed to be more accurate than the local oscillator 10 and counter circuit 16. The first reference frequency signal 42 and second reference frequency signal 43 are representations of frequency indicated by the reference time source 11 at the first time and at the second time, respectively, and which are standards used to measure the frequency signals 41, 44 of the periodic signal generated by the local oscillator 10. The system 100 is capable of detecting availability of and receiving information from the reference time source 11 and can measure the time error and frequency error between the reference time source 11 and the local oscillator 10 and counter circuit 16 at both the first time and the second time; however, the system 100 typically has no access to any external reference time source at interval times between the first time and the second time and therefore cannot measure time error or frequency error at interval times between the first time and the second time.

At the first time, the first time signal 31 may be synchronized with the first reference time signal 32, thus setting the first time signal 31 to be substantially equal to the first reference time signal 32. Likewise at the first time, the first frequency signal 41 may be calibrated with the first reference frequency signal 42, thus setting the first frequency signal 41 to be substantially equal to a nominal reference frequency signal having a predetermined frequency value.

The power source 12 stores or generates power and delivers the power, typically on the order of hundreds of milliwatts or less, to the various components and subsystems of the system 100. The power source 12 is generally a battery; however, it is contemplated that other types of power sources may be suitable without loss of performance while operating the system 100.

The processor 13 may be configured to receive any of the signals 31, 32, 33, 34, 35, 41, 42, 43, 44, 51, 53, and 54, and perform any of the algorithms or calculations as required by the software modules 201, 220, 240, 260, and 290. The processor 13 may be further configured to transmit the results of the algorithms or calculations to the receiving device 21 via the communication port 20 or to the computer-readable storage medium 14. The processor 13 may be embodied as a general purpose integrated circuit, an application specific integrated circuit, a field-programmable gate array or equivalent, a low-power microprocessor, and/or other programmable logic devices.

The computer-readable storage medium 14 may be configured to store numerical values for or other information related to any of the signals 31, 32, 33, 34, 35, 41, 42, 43, 44, 51, 53 and 54. The computer-readable storage medium 14 may be configured to store any of the software modules 201, 220, 240, 260, and 290, as well as estimations, calculated results, time-tag data sets 212 and 262, or other information associated with the software modules, such as predetermined models or characteristic parameters. Many types of computer-readable storage medium 14 are suitable for the system 100 to operate efficiently, including, but not limited to, Flash memory, RAM, and EEPROM. The computer-readable storage medium 14 may be integrated into or embedded within the processor 13.

The phase meter 15 may be configured to measure the relative phases between the first time signal 31 and the first reference time signal 32 as well as the relative phases between the second time signal 33 and the second reference time signal 34. The phase meter 15 may be further configured to measure the relative frequency between the first frequency signal 41 and the first reference frequency signal 42 as well as the relative frequency between the second frequency signal 44 and the second reference frequency signal 43. In various embodiments, the phase meter 15 may be a self-embedded phase meter, an external time interval counter circuit, or an external measurement system 19, any one of which is configured to timestamp a one pulse per second time signal or to measure a frequency signal. The counter circuit 16 receives the periodic signal from the local oscillator 10 and generates time signals 31, 33, and 35 in a desired format, such as seconds from an initial time or the date and time of measurements. The communication port 20 may facilitate communication of information between the system 100 and external devices 11, 19, and 21 as well as enable a user to make various measurements within the system 100 at any time. The external measurement system 19 may be used to make measurements of the frequency signals 41, 44.

The temperature sensor 18 may be configured to determine temperature in proximity to the local oscillator 10 at any time before, after, or during deployment of the system 100. In various embodiments, the temperature sensor 18 may be a thermistor, thermocouple, a resistance temperature detector, semiconductor junctions, or other forms of temperature sensors.

The sensor 17 may be configured to determine sensor data in proximity to the local oscillator 10 or sensor data being externally directed towards the local oscillator 10. Examples of sensors 17 include, but are not limited to, pressure sensors, acceleration sensors, position sensors, gyroscopes, inertial sensors, geophones, sensors used for ocean bottom seismic nodes (OBSN), underwater autonomous vehicles (UAV), land seismic exploration devices, and sensors used in other GPS denied environment or low power applications.

The software modules 201, 220, 240, 260, and 290 tangibly embody program, functions, and/or instructions that the processor 13 to perform operations, tasks or actions as described herein. Suitable software, as applicable, may be readily provided by those of skill in the pertinent art(s) using the teachings presented herein and appropriate programming languages and tools, such as Java, Pascal, Python, C++, C, database languages, SDKs, firmware, microcode, and/or other languages and tools. Representative data may refer to tabulated data, graphical data, or functional relationships.

The microcontroller configuration module 201 may comprise a set of computer instructions or computer executable code for configuring the processor 13 using time signals from the local oscillator 10. The microcontroller configuration module 201 may comprise a set of computer instructions or computer executable code for monitoring, controlling, signal processing, and automating various components within the system 100 or for protecting monitored components within the system 100. The microcontroller configuration module 201 may comprise a set of computer instructions or computer executable code for zeroing, resetting, or otherwise setting any time signals measured by the phase meter 15 or the counter circuit 16 to desired values or converting any time signal units to desired units, such as seconds, minutes, days, years, or specific dates and specific times. The microcontroller configuration module 201 may comprise representative data of an uncorrected time-tag data set 212, wherein the uncorrected time-tag data set 212 comprises representative data of the first time signal 31, the second time signal 33, or one or more interval time signals 35 received from the phase meter 15 or counter circuit 16.

The temperature determination module 220 may comprise representative data of the first temperature signal 51, the second temperature signal 53, and one or more interval temperature signals 54 received from the temperature sensor 18. The temperature determination module 220 may comprise a set of computer instructions or computer executable code for converting temperature signals 51, 53, or 54 received from the temperature sensor 18 into appropriate units of temperature using a predetermined model or a manufacturer's datasheet.

The time error determination module 240 may comprise a set of computer instructions or computer executable code for calculating relative phases of time signals measured by the phase meter 15. Relative phases between the periodic signal generated by the local oscillator 10 and reference time signals 32, 34 generated respectively by the reference time source 11 at the first time and at the second time represent time errors and may be calculated using a variety of suitable techniques, which may include, but are not limited to, a coarse measurement, a fine measurement, a single-point or multipoint self-calibration measurement, or a combination of measurements for a continuous one second measurement range without glitches. The time error determination module 240 may comprise a set of computer instructions or computer executable code for calculating a first time error, denoted as $\delta T_1$, by using Equation 1, where $T_1$ and $t_1$ represent the first time signal 31 and the first reference time signal 32, respectively. The time error determination module 240 may comprise a set of computer instructions or computer executable code for calculating a second time error, denoted as $\delta T_2$, by using Equation 2, where $T_2$ and $t_2$ represent the second time signal 33 and the second reference time signal 34, respectively.

$$\delta T_1 = (T_1 - t_1) \quad \text{Equation 1}$$

$$\delta T_2 = (T_2 - t_2) \quad \text{Equation 2}$$

If the local oscillator 10 and counter circuit 16 are synchronized with the reference time source 11 at the first time, then the first time signal 31 is substantially equal to the first reference time signal 32; furthermore, if the frequency of the local oscillator 10 is calibrated at the first time, then the first frequency signal 41, denoted as $f_1$, is set substantially equal to a nominal reference frequency signal, denoted as $f_0$, and therefore any of the equations $f_1 = f_0$, $T_1 = t_1$, and $\delta T_1 = 0$.

The time error determination module 240 may comprise a set of computer instructions or computer executable code for calculating a time-dependent time error estimation, denoted as $\delta T(T)$, by using Equation 3, which is a dual-linear estimation that takes into account the sum of a linear frequency drift time error estimation and a linear time drift time error estimation, where T represents interval time signals measured by the local oscillator 10 and is constrained to $T_1 \leq T \leq T_2$. Equation 3 is able to achieve highly accurate interval time error estimations $\delta T(T)$ that are used by the time signal reconstruction module 260 to generate a corrected time-tag data set 262 having values of $T - \delta T(T)$ at one or more interval times.

$$\delta T(T) = (f_2 - f_1) * (T - T_1)^2 / [2 * f_0 * (T_2 - T_1)] + (T - T_1) * [\delta T_2 - \delta T_1 - (T_2 - T_1) * (f_2 - f_1) / (2 * f_0)] / (T_2 - T_1) \quad \text{Equation 3}$$

In various embodiments, the temperature in proximity to the local oscillator 10 at the first time or at the second time, denoted respectively by $K_1$ and $K_2$ and measured in units of kelvin or centigrade, may have significantly different values. In this case, the time error determination module 240 may comprise a set of computer instructions or computer executable code for calculating a total time error estimation by using Equation 4, which provides an estimation for the frequency drift rate of the local oscillator 10 and therefore provides a more accurate linear frequency drift time error estimation by normalizing $f_1$ and $f_2$ to $f_1(K)$ and $f_2(K)$ at any convenient temperature K, with the available temperature characteristic of the local oscillator 10.

$$\delta T(T) = [(f_2(K) - f_1(K)) * (T - T_1)^2 / [2 * f_0 * (T_2 - T_1)] + (T - T_1) * \{\delta T_2 - \delta T_1 - (T_2 - T_1) * [f_2(K) - f_1(K)] / (2 * f_0)\} / (T_2 - T_1) \quad \text{Equation 4}$$

The time error determination module 240 may comprise a set of computer instructions or computer executable code for determining and computing a total time error estimation at the first time, at the second time, at any interval time between the first time and the second time, at a time prior to the first time, or at a time after the second time. The temperatures $K_1$ and $K_2$, may differ significantly from the temperature in proximity to the local oscillator 10 at one or more interval times during deployment, denoted by $K_D$. As a result of this possible temperature difference, a total time error estimation that takes into consideration the frequency drift of the local oscillator 10 at various temperatures may further improve the accuracy of error estimation and corrections made by the clock system 100.

In various embodiments, the time error determination module 240 may comprise a set of computer instructions or computer executable code for determining a temperature-dependent time error estimation from temperature characteristics based on testing performed on a representative local oscillator 10, from storage data for temperature characteristics of local oscillator 10, or predetermined model for the drift behavior of the local oscillator 10 as a function of temperature, or from measurements taken by the temperature sensor 18 and the local oscillator 10 during operation of the system 100. In various embodiments, the temperature-dependent time error estimation, denoted as $\delta T_{TCD}$, may be calculated by Equation 5, where the temperature-dependent frequency f(K) has been well characterized.

$$\delta T_{TCD} = (T_2 - T_1) * [f(K_D) - f_1]/f_0 \quad \text{Equation 5}$$

In various embodiments wherein the clock system 100 is at a particular deployment site for an extensive period of time soon after the first time and just before the second time, a first frequency offset estimation may be included with the measured first frequency signal 41 to set the first frequency signal 41 substantially equal to a nominal reference frequency signal.

In various embodiments wherein the clock system 100 is at a particular deployment site for a period of time long after the first time and long before the second time, one of two error estimating techniques may be implemented for the time error estimation during transitions both at the beginning and at the end of the deployment, depending on the temperature dependent nature of the local oscillator 10. In embodiments wherein the frequency of the local oscillator 10 is known to vary substantially linear with time due to a temperature difference, a first linear offset value, denoted by $\delta T_{TC1}$, and a second linear offset value, denoted by $\delta T_{TC2}$, may be calculated by Equation 6 and Equation 7, respectively.

$$\delta T_{TC1} = \Delta T_1 * [f_1(K_D) - f_1]/(2*f_0) \quad \text{Equation 6}$$

$$\delta T_{TC2} = \Delta T_2 * [f_2 - f_2(K_D)]/(2*f_0) \quad \text{Equation 7}$$

In embodiments wherein the frequency of the local oscillator 10 is known to vary substantially similar to a step function with time due to a temperature difference, a first step offset value, denoted by $\delta T_{TC3}$, and a second step offset value, denoted by $\delta T_{TC4}$, may be calculated by Equation 8 and Equation 9, respectively.

$$\delta T_{TC3} = (\Delta T_1) * [f_1(K_D) - f_1]/(f_0) \quad \text{Equation 8}$$

$$\delta T_{TC4} = (\Delta T_2) * [f_2 - f_2(K_D)]/(f_0) \quad \text{Equation 9}$$

In Equations 6-9, the value of $\Delta T_1$ corresponds to the difference in time between the synchronization at the first time and the time that the system 100 reaches the deployment site, and the value of $\Delta T_2$ corresponds to the difference in time between the time when the system 100 leaves the deployment site and the time in which the system reestablishes communication with the reference time source 11 and receives the second reference time signal 34 and second reference frequency signal 43.

The time signal reconstruction module 260 may comprise a set of computer instructions or computer executable code for computing a dual-linear time error estimation by using Equation 10. A corrected time-tag data set 262 may be generated by subtracting the computed time error estimations $\delta T(T)$ from the corresponding measured values T of interval time signals 35 comprised within the uncorrected time-tag data set 212, wherein the values of T−$\delta T(T)$ in the corrected time-tag data set 262 are substantially more accurate than the values of T in the uncorrected time-tag data set 212. In Equation 10, $T_{p1} = T_1 + \Delta T_1$, $T_{p2} = T_2 - \Delta T_2$, and $T_{p1} \leq T \leq T_{p2}$; furthermore, the value for $\delta T_{TC}$ may be substantially equal to any one of the sums $\delta T_{TC1} + \delta T_{TC2}$, $\delta T_{TC3} + \delta T_{TC4}$, $\delta T_{TC1} + \delta T_{TC4}$, or $\delta T_{TC2} + \delta T_{TC3}$. In embodiments wherein the value of $\Delta T_1$ is substantially small, then $\delta T_{TC1}$ and $\delta T_{TC3}$ could be removed from the value of $\delta T_{TC}$ in Equation 10 without introducing a significant error in calculating $\delta T(T)$. Likewise, in embodiments wherein the value of $\Delta T_2$ is substantially small, then $\delta T_{TC2}$ and $\delta T_{TC4}$ could be removed from the value of $\delta T_{TC}$ in Equation 10 without introducing a significant error in calculating $\delta T(T)$.

$$\delta T(T) = [f_2(K_D) - f_1(K_D)]*(T - T_{p1})^2 / [2*f_0*(T_{p2} - T_{p1})] + (T - T_{p1})*[f_1(K_D) - f_1]/f_0 + (T - T_{p1})*\{\delta T_2 - \delta T_1 - (T_{p2} - T_{p1})*[f_2(K_D) - f_1(K_D)]/(2*f_0) - (T_{p2} - T_{p1})*[f_1(K_D) - f_1]/f_0 - \delta T_{TC}\}/(T_{p2} - T_{p1}) \quad \text{Equation 10}$$

The communication module 290 may comprise a set of computer instructions or computer executable code for communicating information between components and modules within the system 100 and may further comprise a set of computer instructions or computer executable code for communicating any information within the system 100 from a reference time source 11, to and from an external measurement system 19, or to an external receiving device 21.

Figure 1B:
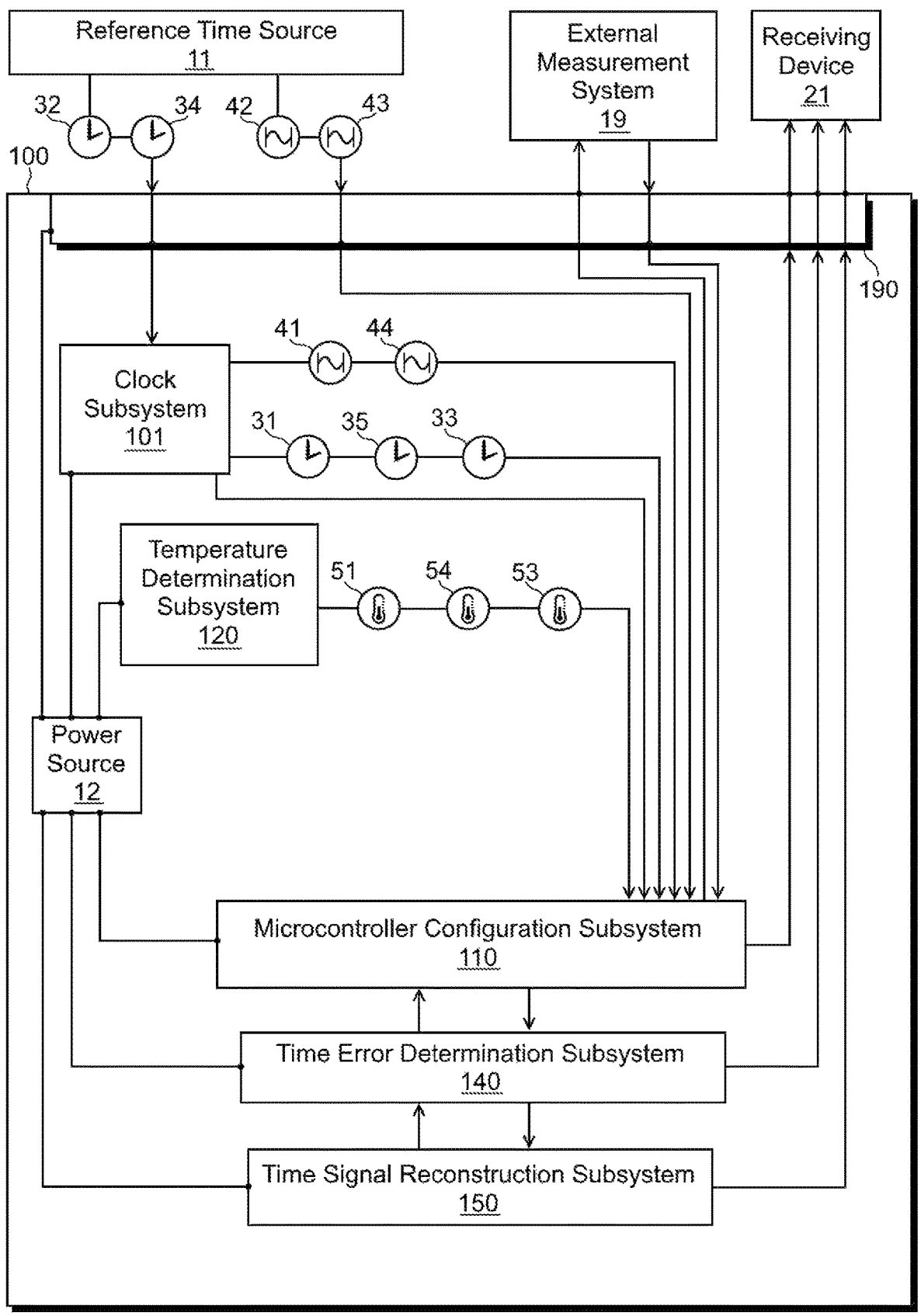
FIG. 1B illustrates a block diagram of alternate embodiment of a time error correcting clock system, in accordance with an exemplary embodiment of the present invention.

FIG. 1B illustrates a block diagram of alternate embodiment of a time error correcting clock system 100, in accordance with an exemplary embodiment of the present invention. The system 100 may comprise a power source 12, a clock subsystem 101, a microcontroller configuration subsystem 110, a temperature determination subsystem 120, a time error determination subsystem 140, a time signal reconstruction subsystem 150, and a communication subsystem 190.

The clock subsystem 101 may be configured to generate a first time signal 31 and a first frequency signal 41 at a first time, a second time signal 33 and a second frequency signal 44 at a second time, and one or more interval time signals 35 that may be used by the temperature determination subsystem 120, the time error determination subsystem 140, the time signal reconstruction subsystem 150, and/or the communication subsystem 190.

The microcontroller subsystem 110 may be configured to synchronize the processor 13 with the periodic signal from the local oscillator 10. The microcontroller subsystem 110 may be configured to monitor, control, signal processing, and automate components within the system 100 or to protect monitored components within the system 100. The microcontroller subsystem 110 may be configured to zero, reset, or otherwise set any time signals measured by the phase meter 15 to desired values or convert any time signal units to desired units, such as seconds, minutes, days, years, or specific dates and specific times.

The temperature determination subsystem 120 may be configured to acquire or provide temperature measurements that may be used by the time error determination subsystem 140 to generate a temperature-dependent time error estimation or a total time error estimation that may be used by the communication subsystem 190.

The time error determination subsystem 140 may be configured to generate a time-dependent time error estimation or a total time error estimation that may be used by the time signal reconstruction subsystem 150 or the communication subsystem 190. The time signal reconstruction subsystem 150 may be configured to generate a corrected time-tag data set 262 that may be used by the communication subsystem 190.

The communication subsystem 190 may be configured to facilitate communication of any information between any of the components or subsystems 101, 110, 120, 140, 150, or 190 in the system 100. The communication subsystem 190 may comprise analog signal lines, digital signal lines, optical signal lines, or other communication interfaces. The communication subsystem 190 may be configured to transmit any information within the system 100 to at least one receiving device 21.

Figure 2A:
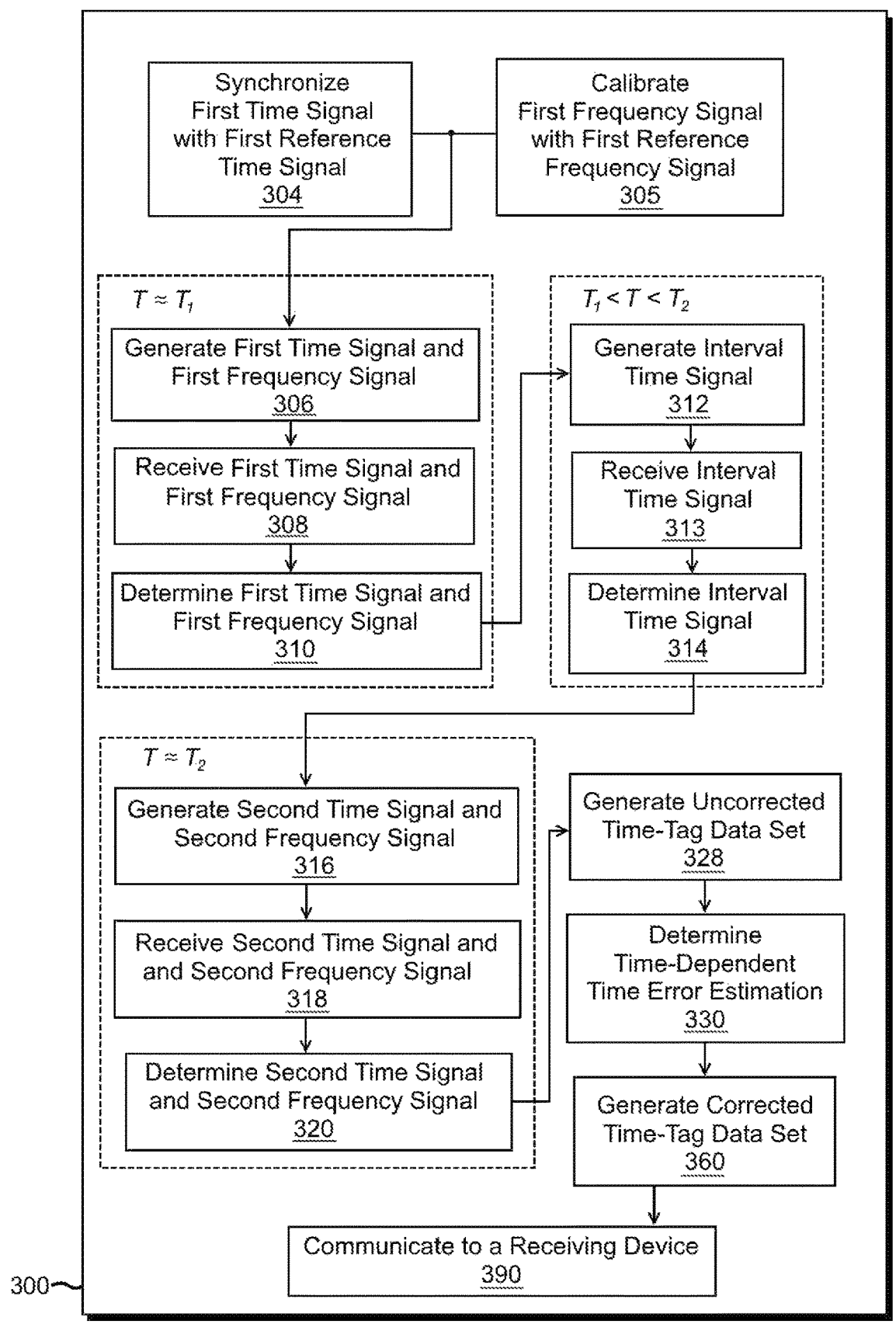
FIG. 2A illustrates a flow chart of one embodiment of the time error correction method consistent with embodiments of the present disclosure.
Figure 2B:
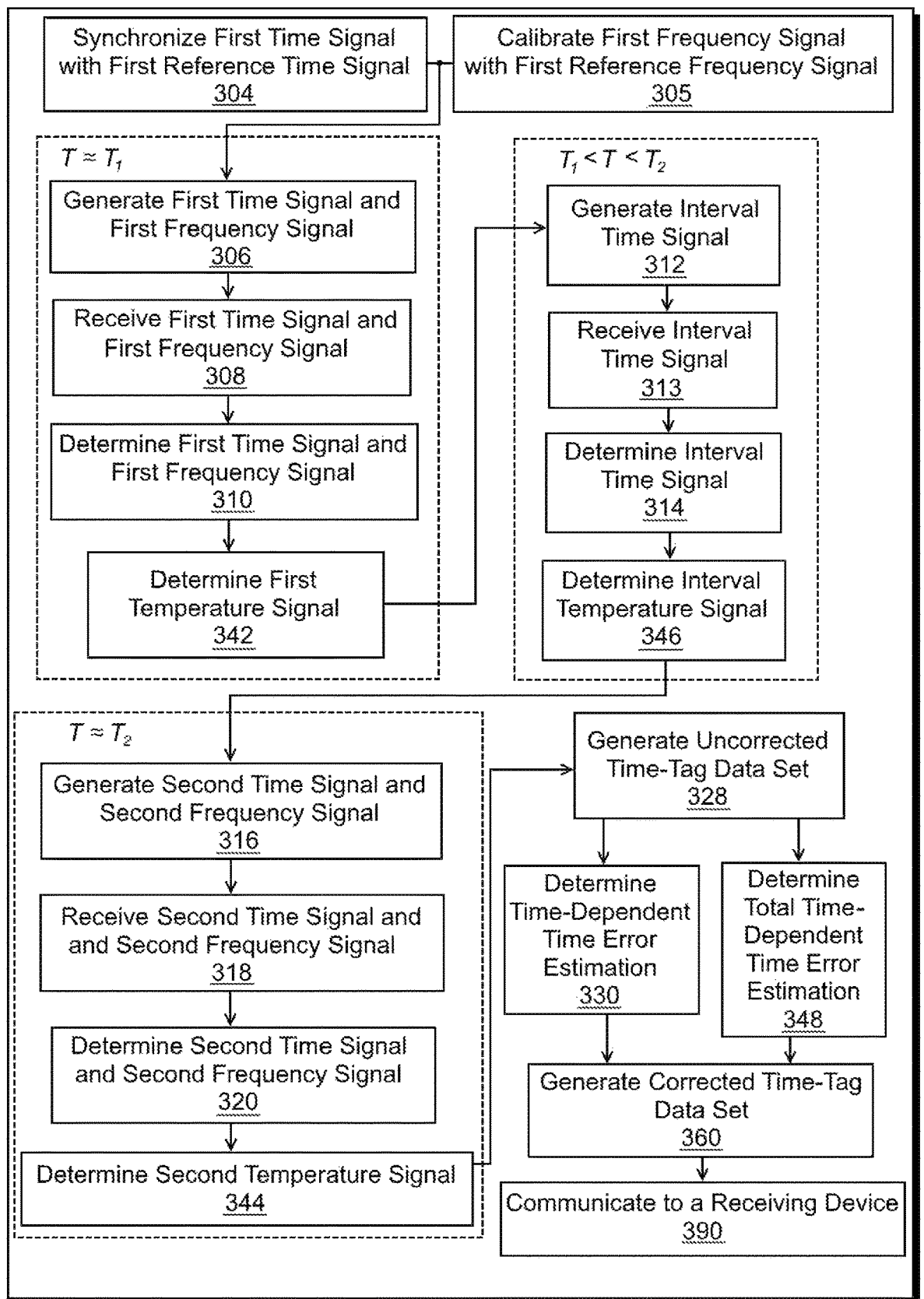
FIG. 2B illustrates a flow chart of an alternative embodiment of the time error correction method consistent with embodiments of the present disclosure.

FIG. 2A illustrates a flow chart of one embodiment of the time error correction method 300 consistent with embodiments of the present disclosure. FIG. 2B illustrates a flow chart of an alternative embodiment of the time error correction method 300 consistent with embodiments of the present disclosure. The time error correction method 300 may comprise the steps of determining the first time signal 31 and the first frequency signal 41 (310), determining the second time signal 33 and the second frequency signal 44 (320), and generating a time-dependent time error estimation from the first time signal 31, the first frequency signal 41, the second time signal 33, and the second frequency signal 44 (330).

The time error correction method 300 may further comprise the steps of generating the first time signal 31 and the first frequency signal 41 at the first time (306), receiving a first reference time signal 32 and a first reference frequency signal 42 (308), synchronizing the first time signal 31 with the first reference time signal 32 (304), calibrating the first frequency signal 41 with the first reference frequency signal 42 (305), generating one or more interval time signals 35 (312), receiving one or more interval time signals 35 (313), determining the interval time signals 35 (314), generating the second time signal 33 and the second frequency signal 44 at the second time (316), receiving the second reference time signal 34 and a second reference frequency signal 43 (318), generating an uncorrected time-tag data set 212 from the first time signal 31, the second time signal 33, or one or more interval time signals 35 (328), or generating a corrected time-tag data set 262 from the time-dependent time error estimation and the uncorrected time-tag data set 212 or the total time error estimation and the uncorrected time-tag data set 212 (360), wherein the first reference time signal 32 and the first reference frequency signal 42 are generated by the reference time source 11 at the first time, wherein the second reference time signal 34 and the second reference frequency signal 43 are generated by the reference time source 11, wherein the time-dependent time error estimation may also be generated from the first reference time signal 32 and the second reference time signal 34.

In various embodiments, the time error correction method 300 may further comprise the steps of determining a first temperature signal 51 at the first time (342), determining a second temperature signal 53 at the second time (344), determining one or more interval temperature signals 54 at the corresponding one or more interval times (346), or generating a temperature-dependent time error estimation from the first temperature signal 51, the second temperature signal 53, or the one or more interval temperature signals 54 (348).

In various embodiments, the time error correction method 300 may further comprise the steps of communicating the temperature-dependent time error estimation, the time-dependent time error estimation, or the corrected time-tag data set 262 to a receiving device 21 using a communication module 290 (390).

Figure 3:
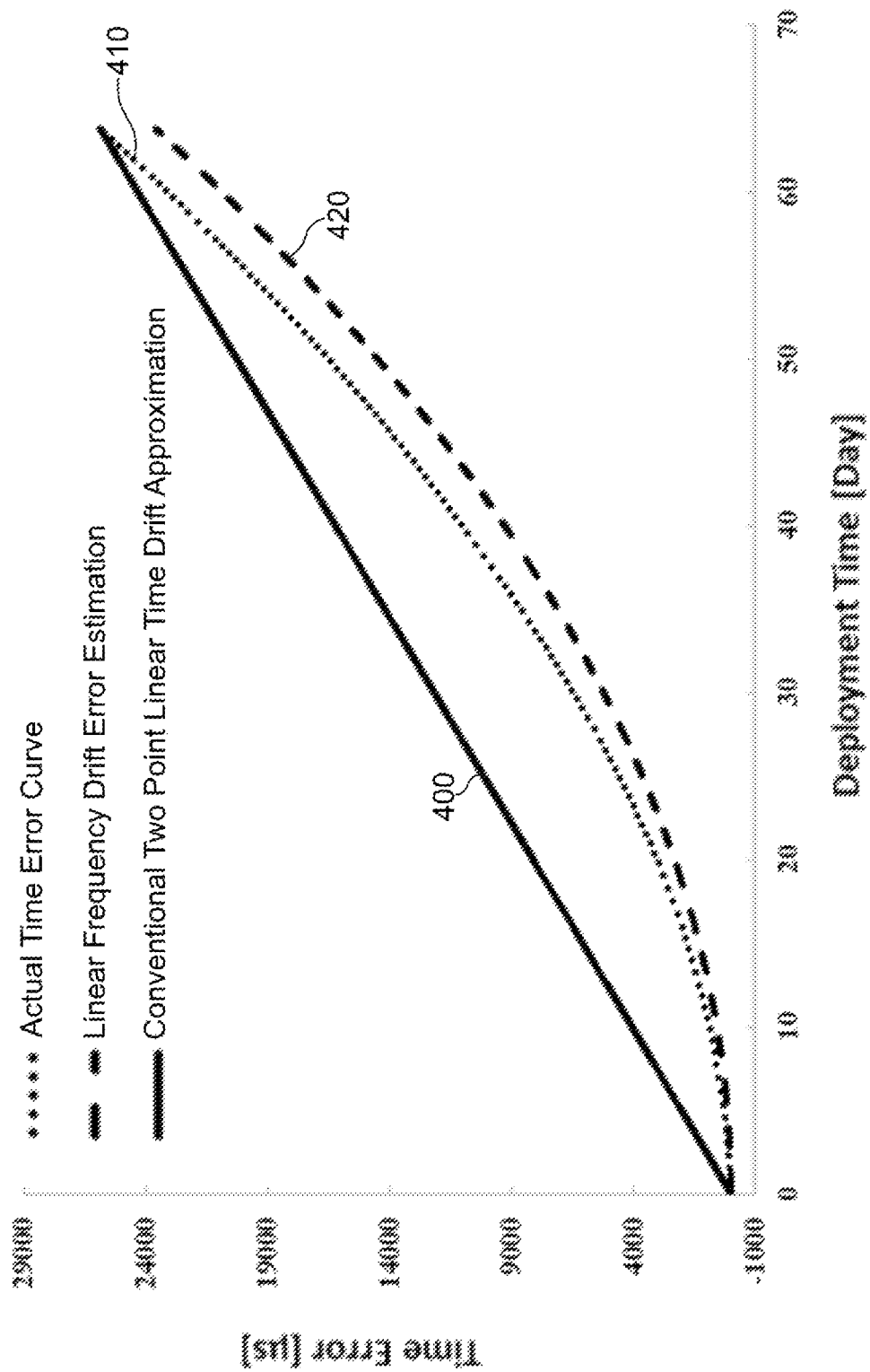
FIG. 3 illustrates an actual time error curve of an example local oscillator over a long-term time deployment, a linear frequency drift error estimation based on the example local oscillator, and a conventional two point linear time drift approximation, in accordance with an exemplary embodiment of the present invention.

FIG. 3 illustrates an actual time error curve 410 of an example local oscillator 10 over a long-term time deployment, a linear frequency drift error estimation 420 based on the example local oscillator 10, and a conventional two point linear time drift approximation 400, in accordance with an exemplary embodiment of the present invention. The actual time error curve 410 is based upon laboratory data collected over an approximate sixty four day deployment for a local oscillator 10 having a nominal frequency near one hertz. The linear frequency drift error estimation 420, denoted by $\delta T_{LFD}(T)$, is related to the difference in frequencies of the local oscillator 10 at the start of and near the end of deployment by Equation 11.

$$\delta T_{LFD}(T) = (f_2 - f_1)*(T-T_1)^2/[2*f_0*(T_2-T_1)] \quad \text{Equation 11}$$

Figure 4:
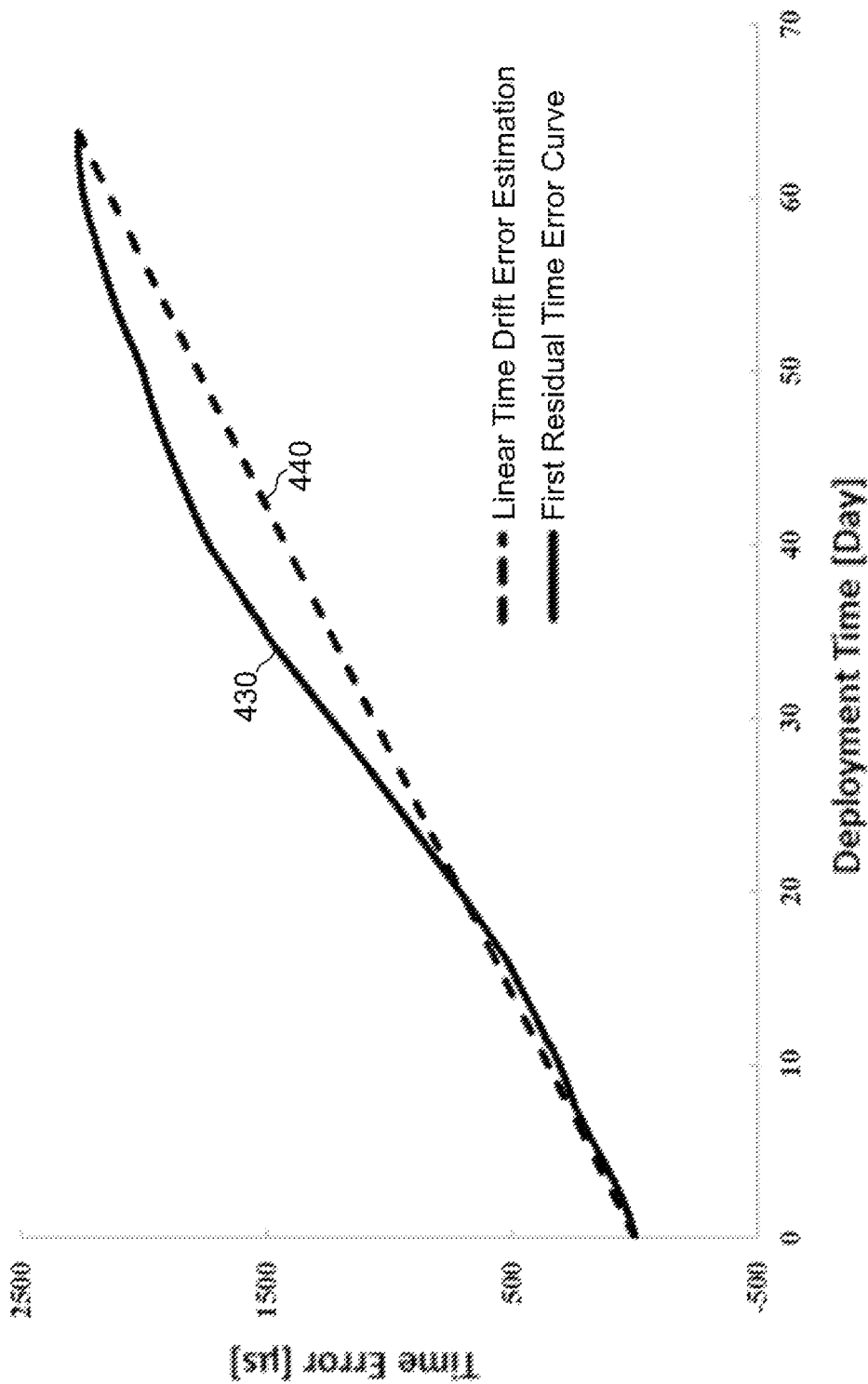
FIG. 4 illustrates a first residual time error curve and a linear time drift error estimation for the example illustrated in FIG. 3, in accordance with an exemplary embodiment of the present invention.

FIG. 4 illustrates a first residual time error curve 430 and a linear time drift error estimation 440 for the example illustrated in FIG. 3, in accordance with an exemplary embodiment of the present invention. The first residual time error curve 430 was generated by subtracting the linear frequency drift error estimation 420 from the actual time error curve 410, and the linear time drift error estimation 440 is generated by implementing Equation 12.

$$\delta T_{LTD}(T) = (T-T_1)*[\delta T_2 - \delta T_1 - (T_2-T_1)*(f_2-f_1)/(2*f_0)]/(T_2-T_1) \quad \text{Equation 12}$$

Figure 5:
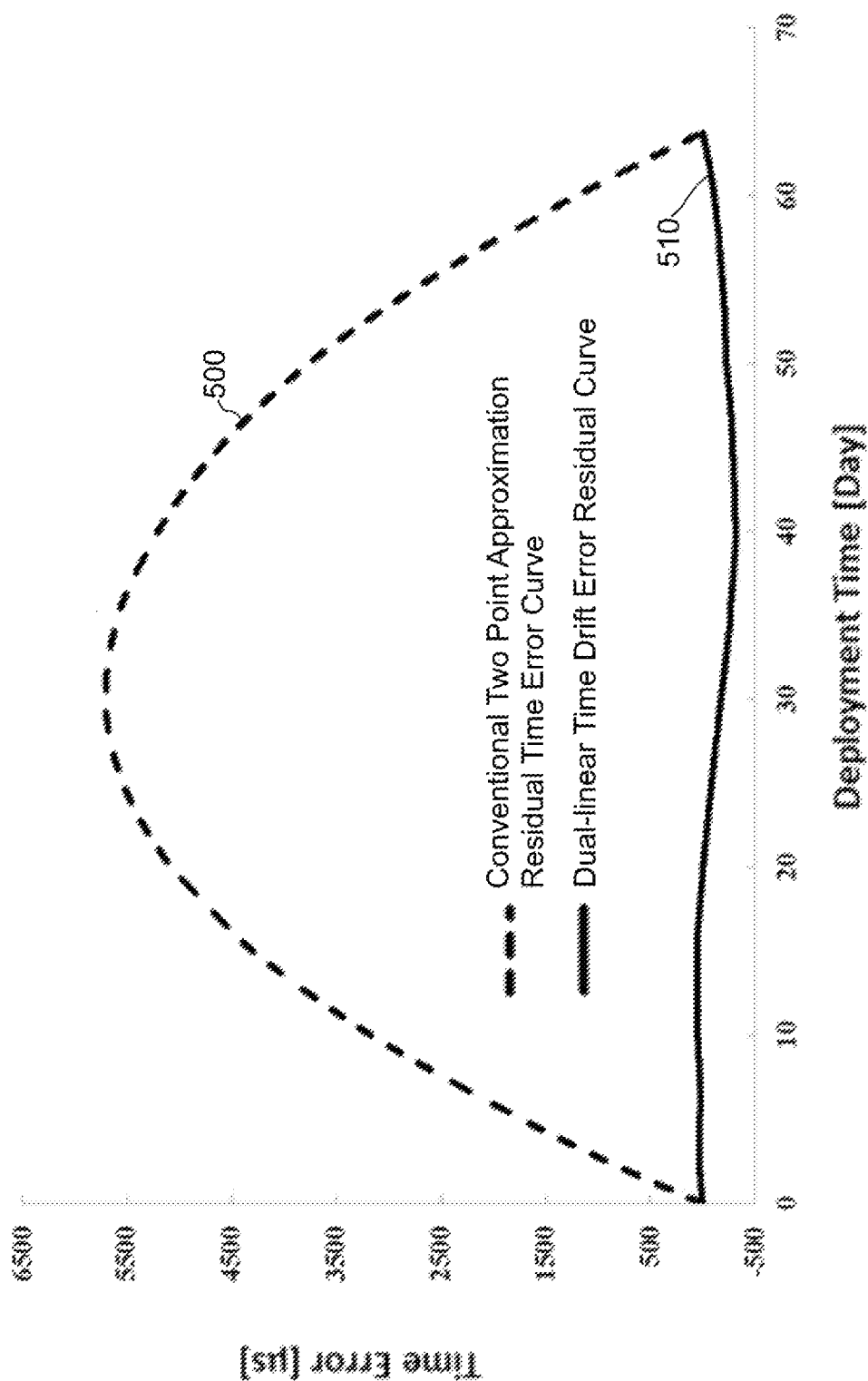
FIG. 5 illustrates a conventional two point approximation residual time error curve and a dual-linear time drift error residual curve, in accordance with an exemplary embodiment of the present invention.

FIG. 5 illustrates a conventional two point approximation residual time error curve 500 and a dual-linear time drift error residual curve 510, in accordance with an exemplary embodiment of the present invention. The conventional two point approximation residual time error curve 500 was generated by subtracting the two point linear time approximation 400 from actual measured time error 410. The dual-linear time drift error residual curve 510 was generated by subtracting the linear time drift error estimation 440 from the first residual time error curve 430. The dual-linear time drift error residual curve 510 demonstrates the effectiveness and accuracy of the time error correction method 300 when implemented using embodiments described herein.

While particular embodiments of the invention have been described and disclosed in the present application, it is clear that any number of permutations, modifications, or embodiments may be made without departing from the spirit and the scope of this invention. Accordingly, it is not the inventor's intention to limit this invention in this application, except as by the claims.

Particular terminology used when describing certain features or aspects of the invention should not be taken to imply that the terminology is being redefined herein to be restricted to any specific characteristics, features, or aspects of the invention with which that terminology is associated. In general, the terms used in the claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention.

The above detailed description of the embodiments of the invention is not intended to be exhaustive or to limit the invention to the precise embodiment or form disclosed herein or to the particular field of usage mentioned in this disclosure. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

In general, the terms used in the claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

In light of the above "Detailed Description," Inventor may make changes to the invention. While the detailed description outlines possible embodiments of the invention and discloses the best mode contemplated, no matter how detailed the above appears in text, the invention may be practiced in a myriad of ways. Thus, implementation details may vary considerably while still being encompassed by the spirit of the invention as disclosed by the inventor. As discussed herein, specific terminology used when describing certain features or aspects of the invention should not be taken to imply that the terminology is being redefined herein to be restricted to any specific characteristics, features, or aspects of the invention with which that terminology is associated.

What is claimed is:

1. A low power time error correcting clock system comprising:
    a local oscillator, wherein said local oscillator is configured to generate a periodic signal, wherein said periodic signal comprises a first frequency signal at a first time and a second frequency signal at a second time;
    a phase meter, wherein a first reference time signal, a first reference frequency signal, a second reference time signal, and a second reference frequency signal are communicated from a reference time source to said phase meter, wherein said phase meter is configured to measure said first frequency signal, said second frequency signal, a first time error, and a second time error;
    a computer-readable storage medium;
    a processor configured to generate a dual-linear time-dependent time error estimation or a dual-linear temperature-dependent time error estimation;
    a counter circuit configured to receive said periodic signal from said local oscillator and generate a first time signal at a first time, a second time signal at a second time, and one or more interval time signals at corresponding interval times; and
    a power source.

2. The time error correcting clock system of claim 1, wherein said first time signal is synchronized with said first reference time signal, wherein said first frequency signal is calibrated to a nominal reference frequency signal.

3. The time error correcting clock system of claim 1, further comprising a communication port configured to facilitate communication of information between said time error correcting clock system and a receiving device, an external measurement system, or the reference time source.

4. The time error correcting clock system of claim 1, further comprising a temperature sensor configured to measure temperature in proximity to said local oscillator, wherein said temperature signal generates a first temperature signal, a second temperature signal, or one or more interval temperature signals.

5. The time error correcting clock system of claim 1, wherein said time-dependent time error estimation is based on said first time signal, said first frequency signal, said second time signal, and said second frequency signal.

6. The time error correcting clock system of claim 4, wherein said temperature-dependent time error estimation is based on said first temperature signal, said second temperature signal, or said one or more interval temperature signals.

7. The time error correcting clock system of claim 1, wherein said processor is further configured to generate a corrected time-tag data set based on an uncorrected time-tag data set and one of either said time-dependent time error estimation or said temperature-dependent time error estimation.

8. The time error correcting clock system of claim 1, wherein said local oscillator is selected from the group consisting of a TCXO, an OCXO, a MEMS time source, a lower power atomic oscillator, a low power microwave oscillator, an optical oscillators, a g-compensated oscillator, a mechanically mounted oscillator with shock and vibration isolation, a clock system further comprising a self-embodied phase meter or time interval counter circuit, and an independent one pulse per second counter circuit.

9. A system for estimating time error, said system comprising:
    a clock subsystem, wherein said clock subsystem is configured to generate a first time signal and a first frequency signal at a first time, wherein said clock subsystem is further configured to generate a second time signal and a second frequency signal at a second time;
    a time error determination subsystem configured to generate a time-dependent time error estimation or a temperature-dependent time error estimation based on a dual-linear estimation; and
    a communication subsystem.

10. The system of claim 9, further comprising a temperature determination subsystem configured to acquire a first temperature signal, a second temperature signal, or one or more interval temperature signals, wherein said time error determination subsystem is further configured to generate said time-dependent time error estimation based on said first temperature signal, said second temperature signal, or said one or more interval temperature signals.

11. A method of time error estimation or correction, the method comprising the steps of:
    determining a first time signal and a first frequency signal;
    determining a second time signal and a second frequency signal; and generating a time-dependent time error estimation from said first time signal, said first frequency signal, said second time signal, and said second frequency signal.

12. The method of claim 11, further comprising the steps of:
generating said first time signal and said first frequency signal at a first time;
receiving a first reference time signal and a first reference frequency signal, wherein said first reference time signal and said first reference frequency signal are generated by a reference time source at the first time;
synchronizing said first time signal with said first reference time signal;
calibrating said first frequency signal with said first reference frequency signal;
generating said second time signal and said second frequency signal at a second time;
losing reception of said reference time source for one or more of the interval times;
receiving a second reference time signal and a second reference frequency signal, wherein said second reference time signal and said second reference frequency signal are generated by said reference time source at the second time;
determining said second reference time signal at the second time;
generating an uncorrected time-tag data set from said first time signal, said second time signal, or said one or more interval time signals;
wherein said time-dependent time error estimation is also generated from said first reference time signal and said second reference time signal.

13. The method of claim 11, further comprising the steps of:
determining a first temperature signal at the first time;
determining a second temperature signal at the second time;
determining one or more interval temperature signals at the corresponding one or more interval times;
generating a temperature-dependent time error estimation from said first temperature signal, said second temperature signal, or said one or more interval temperature signals.

14. The method of claim 11, further comprising the step of generating a corrected time-tag data set from said time-dependent time error estimation and said uncorrected time-tag data set.

15. The method of claim 13, further comprising the step of generating a corrected time-tag data set from a total time-dependent time error estimation and said uncorrected time-tag data set, wherein said total time-dependent time error estimation comprises said time-dependent time error estimation and said temperature-dependent time error estimation.

* * * * *